United States Patent
Mathew et al.

(10) Patent No.: US 9,622,376 B2
(45) Date of Patent: Apr. 11, 2017

(54) METHODOLOGY FOR ELECTRONIC EQUIPMENT TO SELF-IDENTIFY SUBMERSION IN MINERAL OIL

(71) Applicant: DELL PRODUCTS, L.P., Round Rock, TX (US)

(72) Inventors: Abey K. Mathew, Georgetown, TX (US); Wayne K. Cook, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 155 days.

(21) Appl. No.: 14/703,839

(22) Filed: May 4, 2015

(65) Prior Publication Data

US 2016/0330865 A1    Nov. 10, 2016

(51) Int. Cl.
*H05K 7/20* (2006.01)
*H05K 7/14* (2006.01)

(52) U.S. Cl.
CPC ....... *H05K 7/20236* (2013.01); *H05K 7/1492* (2013.01); *H05K 7/20718* (2013.01); *H05K 7/20781* (2013.01); *H05K 7/20836* (2013.01)

(58) Field of Classification Search
CPC . H01L 23/473; H01L 23/44; H01L 2924/181; H05K 7/20772; H05K 7/20236; H05K 7/20809; H05K 7/203; H05K 5/067; H05K 7/20218; H05K 7/20827; H05K 7/20781; H05K 7/20; H05K 7/20745; H05K 7/2079; H05K 7/20281; H05K 7/20872; H05K 7/20927; F28D 1/02; F28D 1/0206; F28D 2021/0028; G06F 1/20; G06F 2200/201; G06F 1/206; G11B 33/1413

See application file for complete search history.

(56) References Cited

U.S. PATENT DOCUMENTS

| | | |
|---|---|---|
| 7,403,384 B2 | 7/2008 | Pflueger |
| 7,893,635 B2 | 2/2011 | Hood, III |
| 7,911,782 B2 | 3/2011 | Attlesey et al. |
| 8,171,314 B2 | 5/2012 | Lovicott |
| 8,405,975 B2 | 3/2013 | Helberg et al. |
| 8,838,286 B2 | 9/2014 | Florez-Larrahondo et al. |
| 2011/0075353 A1* | 3/2011 | Attlesey .................... G06F 1/20 361/679.47 |
| 2011/0132579 A1* | 6/2011 | Best ................... H05K 7/20763 165/104.31 |

(Continued)

FOREIGN PATENT DOCUMENTS

WO    2014130891    8/2014

*Primary Examiner* — Courtney Smith
*Assistant Examiner* — Michael Matey
(74) *Attorney, Agent, or Firm* — Isisdore PLLC

(57) ABSTRACT

An information handling system (IHS) automatically responds to a change in cooling medium that cools functional components. A cooling medium sensor senses a material characteristic of the cooling medium. A thermal management controller determines whether the material characteristic received from the cooling medium sensor is in one of a first range that is associated with the air cooling medium and a second range that is associated with the liquid cooling medium. In response to determining that the material characteristic is within the second range, the thermal management controller disables a thermal mitigation component that reduces a temperature of the functional components of the IHS.

20 Claims, 5 Drawing Sheets

(56) References Cited

U.S. PATENT DOCUMENTS

| | | | |
|---|---|---|---|
| 2014/0181544 A1 | 6/2014 | Breen et al. | |
| 2014/0216686 A1* | 8/2014 | Shelnutt | H05K 7/20809 |
| | | | 165/67 |
| 2014/0218861 A1* | 8/2014 | Shelnutt | G06F 1/20 |
| | | | 361/679.53 |
| 2014/0307384 A1 | 10/2014 | Best | |
| 2015/0013940 A1* | 1/2015 | Best | H05K 7/20763 |
| | | | 165/80.4 |
| 2016/0102880 A1* | 4/2016 | Lovicott | F24F 11/008 |
| | | | 700/300 |
| 2016/0120059 A1* | 4/2016 | Shedd | H05K 7/208 |
| | | | 165/244 |

* cited by examiner

METHODOLOGY FOR ELECTRONIC EQUIPMENT TO SELF-IDENTIFY SUBMERSION IN MINERAL OIL

BACKGROUND

1. Technical Field

This disclosure generally relates to information handling systems (IHS), and more particular to cooling an IHS by submersion in a liquid cooling medium.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Liquid cooling media such as mineral oil are being used as an alternative for cooling electronic equipment due to its cost effectiveness in comparison to traditional air cooling methodology. Empirical data indicates that using a liquid cooling medium and removing fans significantly reduces power consumption in data centers. One problem with using a liquid cooling medium such as mineral oil is that fans have to be disabled because the increased viscosity as compared to air creates a back pressure that tends to burn out the fans.

One approach to avoid fan burn out is to remove the fans and install a special circuit board to mimic the tachometer signal that is output by the fans. The IHS operates without disruption or reverting to a degraded mode due to the special circuit board preventing the IHS from sensing a failed or missing fan. This approach adds additional costs and requires a separate process in manufacturing of the electronic equipment. When not performed by an original equipment manufacturer, this approach can void a warranty as well as create a situation where inadvertent damage can be caused to other components of the IHS.

BRIEF SUMMARY

The illustrative embodiments of the present disclosure provide an information handling system (IHS) that automatically responds to a change in cooling medium. In one or more embodiments, the IHS includes functional components that are disposed within an interior space of a chassis and that require cooling. A cooling medium sensor is positioned to sense a material characteristic of a cooling medium that is present in the interior space. The cooling medium is one of an air cooling medium and a liquid cooling medium. A thermal mitigation component is provided to reduce a temperature of the functional components that are operating in an air cooling medium. The IHS includes a thermal management controller in communication with the thermal mitigation component and the cooling medium sensor. The thermal management controller determines whether the material characteristic received from the cooling medium sensor is in one of a first range that is associated with the air cooling medium or a second range that is associated with the liquid cooling medium. In response to determining that the material characteristic is within the second range, the thermal management controller disables the thermal mitigation component.

According to at least one aspect of the present disclosure, a power supply unit (PSU) of an IHS automatically responds to a change in cooling medium. In one or more embodiments, the PSU includes a housing that has an interior space. The PSU includes electrical conversion components that are disposed within the housing and that supply electrical power to functional components of the IHS. A thermal mitigation component is provided to reduce a temperature of one of the functional components of the IHS and the electrical conversion components of the PSU that are operating in an air cooling medium. A cooling medium sensor is positioned to sense a material characteristic of a cooling medium present in the interior space from among the air cooling medium and a liquid cooling medium. A thermal management controller is placed in communication with the thermal mitigation component and the cooling medium sensor. The thermal controller determines whether the material characteristic received from the cooling medium sensor is in one of a first range that is associated with the air cooling medium and a second range that is associated with the liquid cooling medium. In response to determining that the material characteristic is within the second range, the thermal management controller disables the thermal mitigation component.

According to at least one aspect of the present disclosure, a method is provided of automatically responding to a change in cooling medium in an IHS. In one or more embodiments, the method includes sensing, via a cooling medium sensor, a material characteristic of a cooling medium that is present in an interior space of a chassis of an IHS. The method includes a thermal management controller determining whether a material characteristic that is received from a cooling medium sensor is in one of a first range that is associated with the air cooling medium and a second range that is associated with a liquid cooling medium. The method includes, in response to determining that the material characteristic is within the second range, the thermal management controller disabling a thermal mitigation component utilized to cool components of the IHS operating in an air cooling medium.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
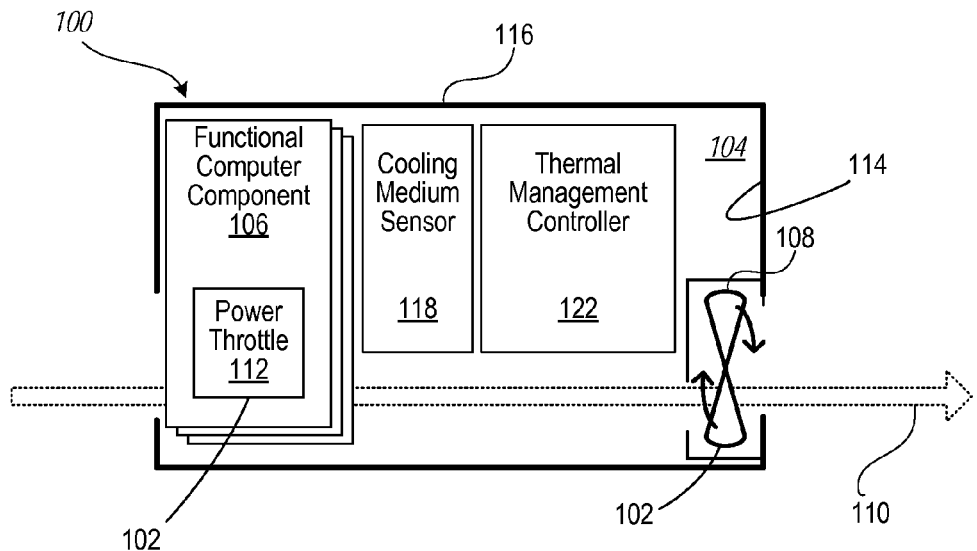
FIG. 1 illustrates a conceptual block diagram of an information handling system (IHS) with thermal mitigation components operating in an air cooling medium to cool functional components, according to one or more embodiments.

An information handling system (IHS) automatically responds to a change in cooling medium that cools functional components. A cooling medium sensor senses a material characteristic of the cooling medium. A thermal management controller determines whether the material characteristic received from the cooling medium sensor is in one of a first range that is associated with the air cooling medium and a second range that is associated with the liquid cooling medium. In response to determining that the material characteristic is within the second range, the thermal management controller disables a thermal mitigation component that reduces a temperature of the functional components of the IHS. Thereby, the present disclosure can reduce power consumption in customer data centers with minimum impact to the reliability and maintainability of the IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates an IHS 100 with thermal mitigation components 102 that are intended to operate in an air cooling medium 104 to reduce a temperature of functional components 106. For clarity, FIG. 1 illustrates two thermal mitigation components 102 of an air mover 108 to move an air flow 110 to cool the functional components 106 and a power throttle 112 to reduce an amount of heat generated by the functional components 106. Examples of the latter include a variable system clock. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
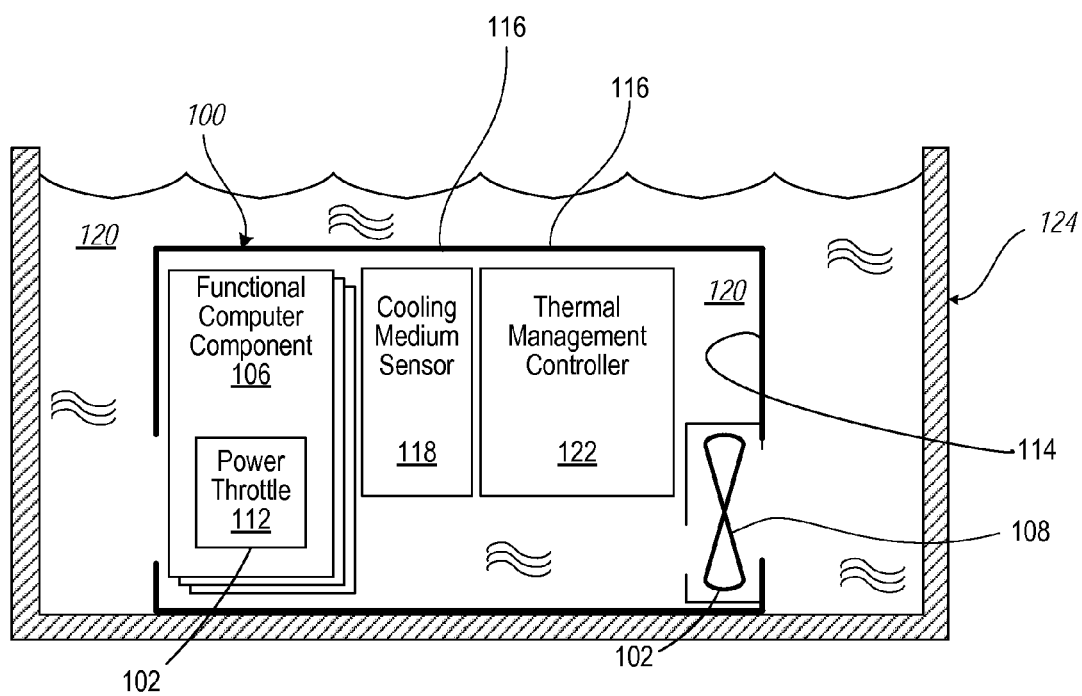
FIG. 2 illustrates a conceptual block diagram of the IHS of FIG. 1 submersed in a liquid cooling medium and with a thermal management controller sensing the liquid cooling medium and disabling the thermal mitigation components, according to one or more embodiments.

In one or more embodiments, the IHS 100 includes functional components 106 that are disposed within an interior space 114 of a chassis 116 and that require cooling. The functional components can be are communicatively interconnected, but are not necessarily so. A cooling medium sensor 118 is positioned to sense a material characteristic of a cooling medium that is present in the interior space. The cooling medium can be one of (a) an air cooling medium 104 and (b) a liquid cooling medium 120 (FIG. 2). A thermal management controller 122 is provided in communication with the cooling medium sensor 118 and the thermal mitigation components 102, specifically the air mover 108 and the power throttle 112. The thermal management controller 122 determines whether the material characteristic received from the cooling medium sensor 118 is in one of a first range that is associated with the air cooling medium 104 and a second range that is associated with the liquid cooling medium 120 (FIG. 2). In response to determining that the material characteristic is within the first range (i.e., identifying the cooling medium as an air cooling medium), the thermal management controller enables the thermal mitigation components 102.

FIG. 2 illustrates the IHS 100 of FIG. 1 submersed in the liquid cooling medium 120 such as mineral oil that is held within a tank 124. In response to determining that the material characteristic is within the second range (i.e., identifying the cooling medium as an air cooling medium), the thermal management controller 122 disables one or more of the thermal mitigation components 102.

Figure 3:
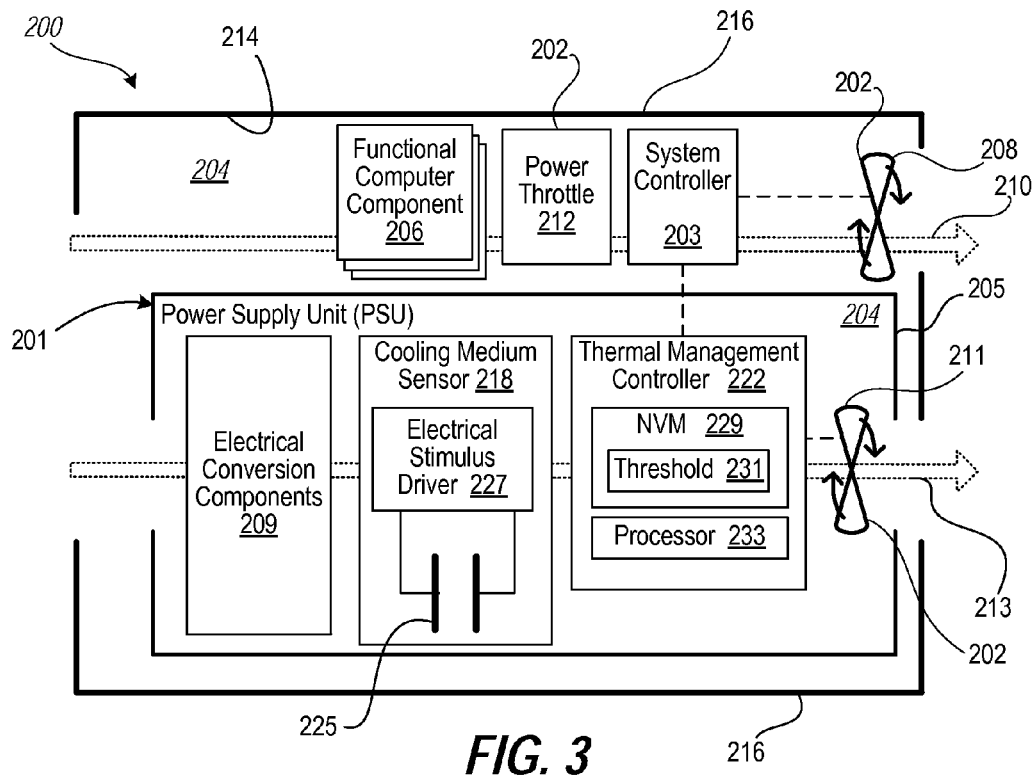
FIG. 3 illustrates a conceptual block diagram of an example IHS with a power supply unit (PSU) with thermal mitigation components operating in an air cooling medium to cool functional components, according to one or more embodiments.
Figure 4:
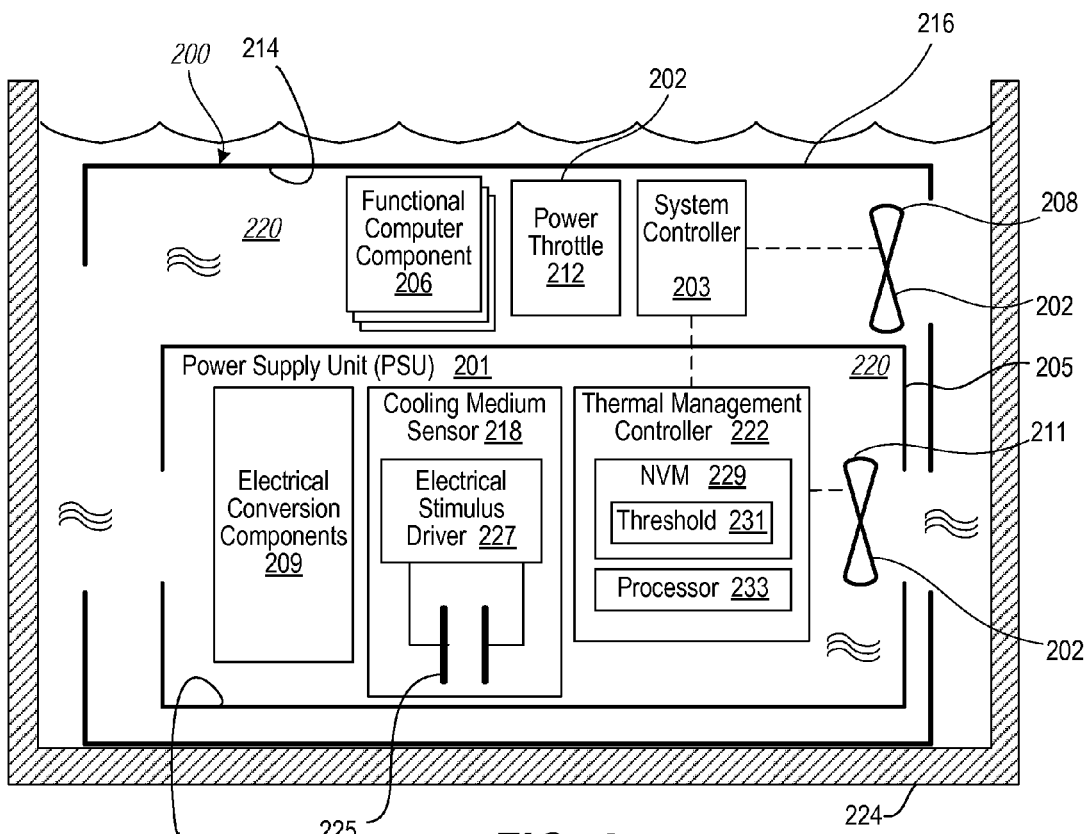
FIG. 4 illustrates a conceptual block diagram of the example IHS of FIG. 3 submersed in a liquid cooling medium and with a thermal management controller of the PSU sensing the liquid cooling medium and disabling the thermal mitigation components, according to one or more embodiments.

FIG. 3 illustrates an example IHS 200 with a power supply unit (PSU) 201 that incorporates aspects of the present disclosure, while economically reduces or avoids changes to a system controller 203 of the IHS 200. For example, the system controller 203 can be a Baseboard Management Controller (BMC). The IHS 200 includes functional components 206 that are disposed within an interior space 214 of a chassis 216 and that require cooling. The PSU 201 can accomplish the benefits of disabling thermal mitigation components 202 when in a liquid cooling medium 220 (FIG. 4). The thermal mitigation components 202 are intended to operate in an air cooling medium 204.

In one or more embodiments, the PSU 201 can include a housing 205 that has a PSU interior space 207. Electrical conversion components 209 are disposed within the housing 205 and supply electrical power to the functional components 206 of the IHS 200. The thermal mitigation component 202 can reduce a temperature of at least one of the functional components 206 of the IHS 200 and the electrical conversion components 209 of the PSU 201 when these components are operating in the air cooling medium 204. In one or more embodiments, the PSU 201 can include a PSU fan 211 to cool the electrical conversion components 209 with a PSU air flow 213. In one or more embodiments, the IHS 200 can include a system fan 208 to cool the functional components 206 with a chassis air flow 210. The IHS 200 can include a power throttle 212, such as a variable system clock, to control an amount of heat generated by the functional components 206.

A cooling medium sensor 218 is positioned to sense a material characteristic of a cooling medium that is present in the PSU interior space 207 from among the air cooling medium 204 and a liquid cooling medium 220 (FIG. 4). A thermal management controller 222 is in communication with the thermal mitigation components 202 and the cooling medium sensor 218. The thermal management controller 222 determines whether the material characteristic received from the cooling medium sensor is in one of a first range that is associated with (or which indicates operation in) the air cooling medium 204 and a second range that is associated with (or which indicates operation in) the liquid cooling medium 220 (FIG. 4). In response to determining that the material characteristic is within the first range, the thermal management controller 222 can enable the thermal mitigation components 202.

FIG. 4 illustrates the example IHS 200 and PSU 201 submersed in the liquid cooling medium 220 contained within a tank 224. In response to determining that the material characteristic is within the second range, the thermal management controller 222 can disable the thermal mitigation components 202.

The exemplary embodiments of FIGS. 3-4 illustrate the cooling medium sensor 218 including a parallel plate capacitor 225 that is energized by an electrical stimulus driver 227. The change in the cooling medium from air or mineral oil and back can be detected by measuring a corresponding change in the capacitance detected by the cooling medium sensor 218. A parallel plate capacitor 225 can be similar to those used in radio frequency (RF) circuits can be mounted on a printed circuit board (PCB) of the PSU 201. The electrical stimulus driver 227 can include digital signal processing (DSP) capability than can inject an electrical stimulus across the parallel plate capacitor 215 and measure the capacitance. The capacitance is given by the equation $C=E*A/d$, where E is the dielectric constant of the medium, A is the area of the parallel plate, and d is the distance between the plates. The capacitance measured in the mineral oil will be more than twice as much as in air as the dielectric constant of mineral oil is 2.2 and that of air is 1. Alternatively, electrical stimulus driver 227 can also inject a direct current (DC) current (i) and measure the voltage across the parallel plate capacitor 225. Capacitance can be determined from a relationship $i=c*dv/dt$) by measuring a rate of change in voltage over a time interval (dv/dt).

In another embodiment, the cooling medium sensor 218 can also detect a difference between air and oil by using a magnetic circuit that includes an inductor or a transformer. An air core solenoid can be mounted on the PCB of the PSU 201, and the inductance can be measured with the air core and with the mineral oil. The permeability (u) of the cooling medium will impact the inductance, and this can be used to differentiate between air and oil.

In one or more embodiments, during in-circuit test (ICT) testing of the PSU 201 when the cooling medium is air cooling medium 204 (FIG. 3), the measured capacitance, which is the change in voltage across the parallel plate capacitor 225, can be measured and stored in PSU nonvolatile memory (NVM) 229 as a threshold 231. When the system build is complete, the stimulus is applied and the capacitance measured each time the IHS 200 is powered on. In one embodiment, processor 233 of the thermal management controller 222 then compares the capacitance (or voltage) to the stored value of the threshold 231 in the NVM 229.

In a particular embodiment, in addition to the NVM 229 and processor 233, the thermal management controller 222 can include (i) a memory communicatively coupled to processor 233, (ii) storage media, (iii) a network interface communicatively coupled to processor 233, and (iv) a power source electrically coupled to processor 233. These components are not specifically illustrated but are known to those skilled in the art as components of IHS. Processor 233 may include any system, device, or apparatus configured to interpret and/or execute program instructions and/or process data. Processor 233 may also include, without limitation a microprocessor, microcontroller, digital signal processor (DSP), Application Specific Integrated Circuit (ASIC), or any other digital or analog circuitry configured to interpret and/or execute program instructions and/or process data. In some embodiments, processor 233 may interpret and/or execute program instructions and/or process data stored in memory and/or another component of IHS 200. Memory may be communicatively coupled to processor 233 and may include any system, device, or apparatus configured to retain program instructions and/or data for a period of time (e.g., computer-readable media). By way of example without limitation, memory may include RAM, EEPROM, a PCM-CIA card, flash memory, magnetic storage, opto-magnetic storage, or any suitable selection and/or array of volatile or non-volatile memory that retains data after power to PSU 201 is turned off or power to PSU 201 is removed. Network interface may include any suitable system, apparatus, or device operable to serve as an interface between PSU 201 and a network. Network interface may enable the PSU 201 to communicate over network using any suitable transmission protocol and/or standard, including without limitation all transmission protocols and/or standards enumerated herein or generally known.

Figure 5:
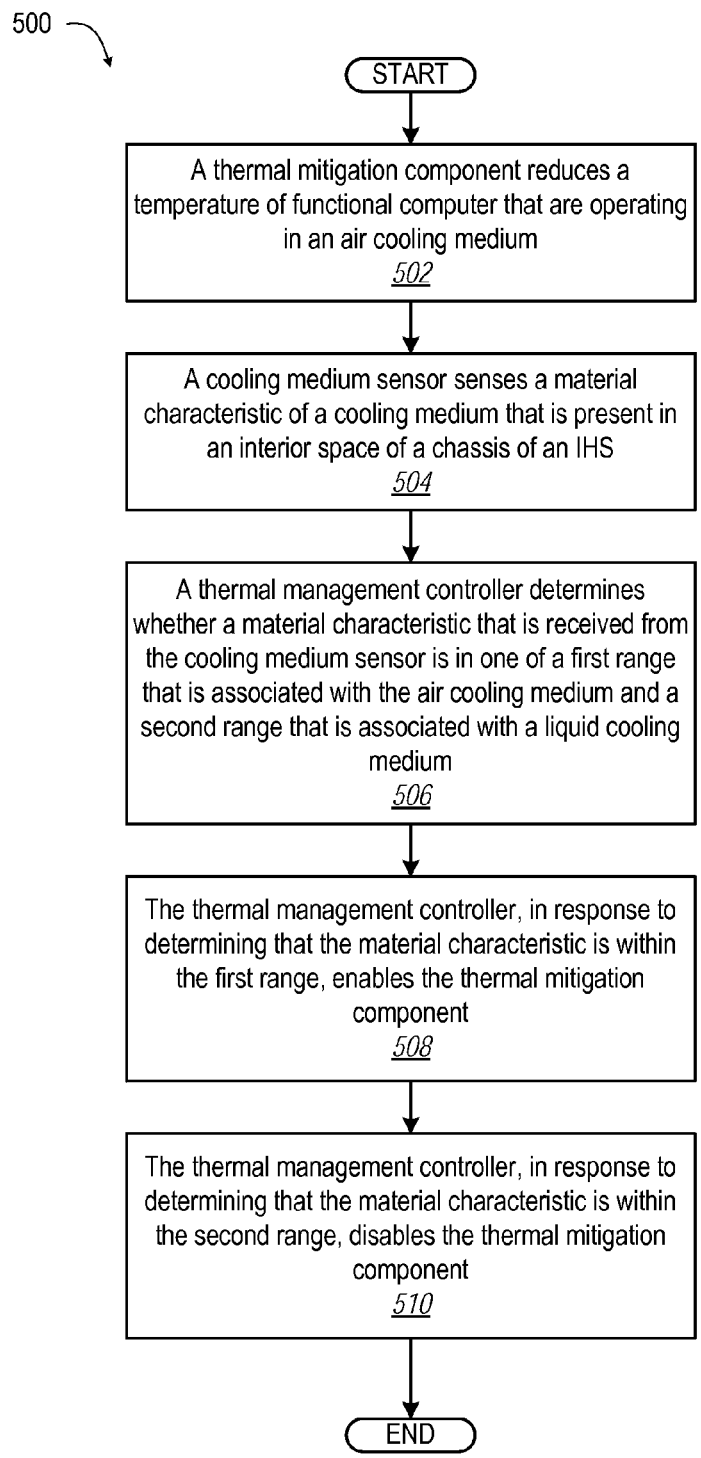
FIG. 5 illustrates a flow diagram of a method of automatically responding to a change in cooling medium, according to one or more embodiments.

FIG. 5 illustrates a method 500 (performed by and/or within an IHS) of automatically responding to a change in cooling medium within an IHS. According to one or more embodiments, a thermal mitigation component reduces a temperature of functional components that are operating in an air cooling medium of the IHS (block 502). A cooling medium sensor senses a material characteristic of a cooling medium that is present in an interior space of a chassis of an IHS (block 504). A thermal management controller determines whether a material characteristic that is received from the cooling medium sensor is in one of a first range that is associated with the air cooling medium and a second range that is associated with a liquid cooling medium (block 506). The thermal management controller, in response to determining that the material characteristic is within the first range, enables the thermal mitigation component (block 508). The thermal management controller, in response to determining that the material characteristic is within the second range, disables the thermal mitigation component (block 510). In one or more embodiments, the thermal mitigation component includes a power throttle to reduce heat generation by the functional components. In one or more embodiments, the thermal mitigation component includes an air mover that is positioned to move air within at least a portion of the interior space.

Figure 6:
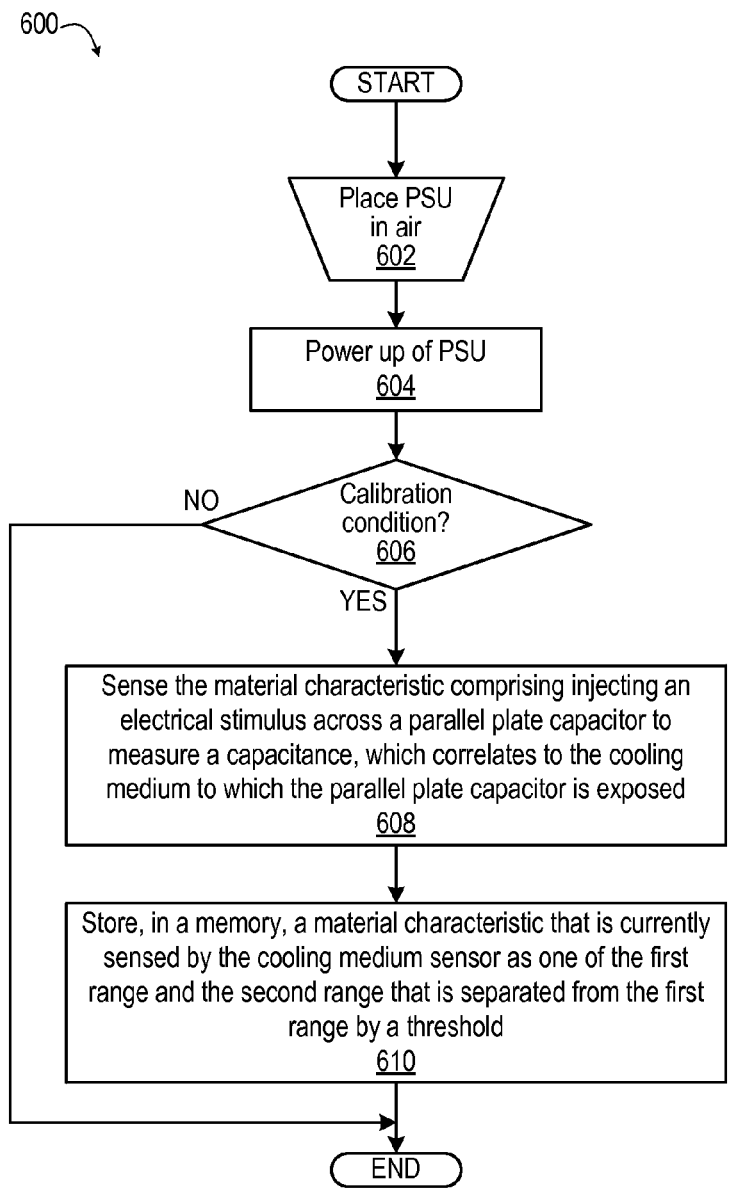
FIG. 6 illustrates a flow diagram of a method of performing a standalone measurement of a material characteristic of the cooling medium during a first-time and subsequent power up condition, according to one or more embodiments.

FIG. 6 illustrates a method 600 of a PSU performing a standalone measurement of a material characteristic of the cooling medium during a first-time system power up condition. For example, an original equipment manufacturer (OEM) can operate a test unit in order to determine a setting to provision a class of devices such as a PSU. In one or more embodiments, each device can have a degree of variability in a sensor such that each device is calibrated during a first time use. According to one or more embodiments, the method 600 includes placing a PSU in air (block 602). The method 600 includes powering on the PSU for the first time (block 604). A thermal management controller of the PSU determines whether a calibration condition exists, such as by accessing a memory to see if a first range or the second range has been provisioned (decision block 606). In response to determining in decision block 606 that a calibration condition does not exist, method 600 exits. In response to determining in decision block 606 that a calibration condition exists, method 600 includes sensing the material characteristic of a cooling medium by applying an electrical stimulus across a parallel plate capacitor to measure a capacitance. The amount of capacitance measured/detected correlates to the cooling medium in which the parallel plate capacity is exposed (block 608). The method 600 includes storing, in memory, the material characteristic that is currently sensed by the cooling medium sensor as one of the first range and the second range. The method also includes storing the other of the first and second range that is separated from the one by a threshold (block 610). Then method 600 exits.

In one embodiment, calibration is performed on one device at an original equipment manufacturer (OEM). The device detects that it is in a calibration mode and stores the detected material characteristic to a default one of the first and second range. For example, operators can procedurally ensure that the device is in a cooling medium that corresponds to the default range. In another example, the device incorporates an approximate value for air cooling medium or liquid cooling medium. Calibration provides an adjustment to the closer of the two approximate values. In an additional example, the device can be selectably configured to one of the first and second ranges, such as by a test pin or user interface. One of the first and second ranges can be deterministically set based upon an empirical value for the other. In one or more embodiments, both values can be empirically determined in sequential tests. In one or more embodiments, each device can be calibrated upon first power up. In one or more embodiments, the OEM can be provisioned with values obtained on a representative test article.

Figure 7:
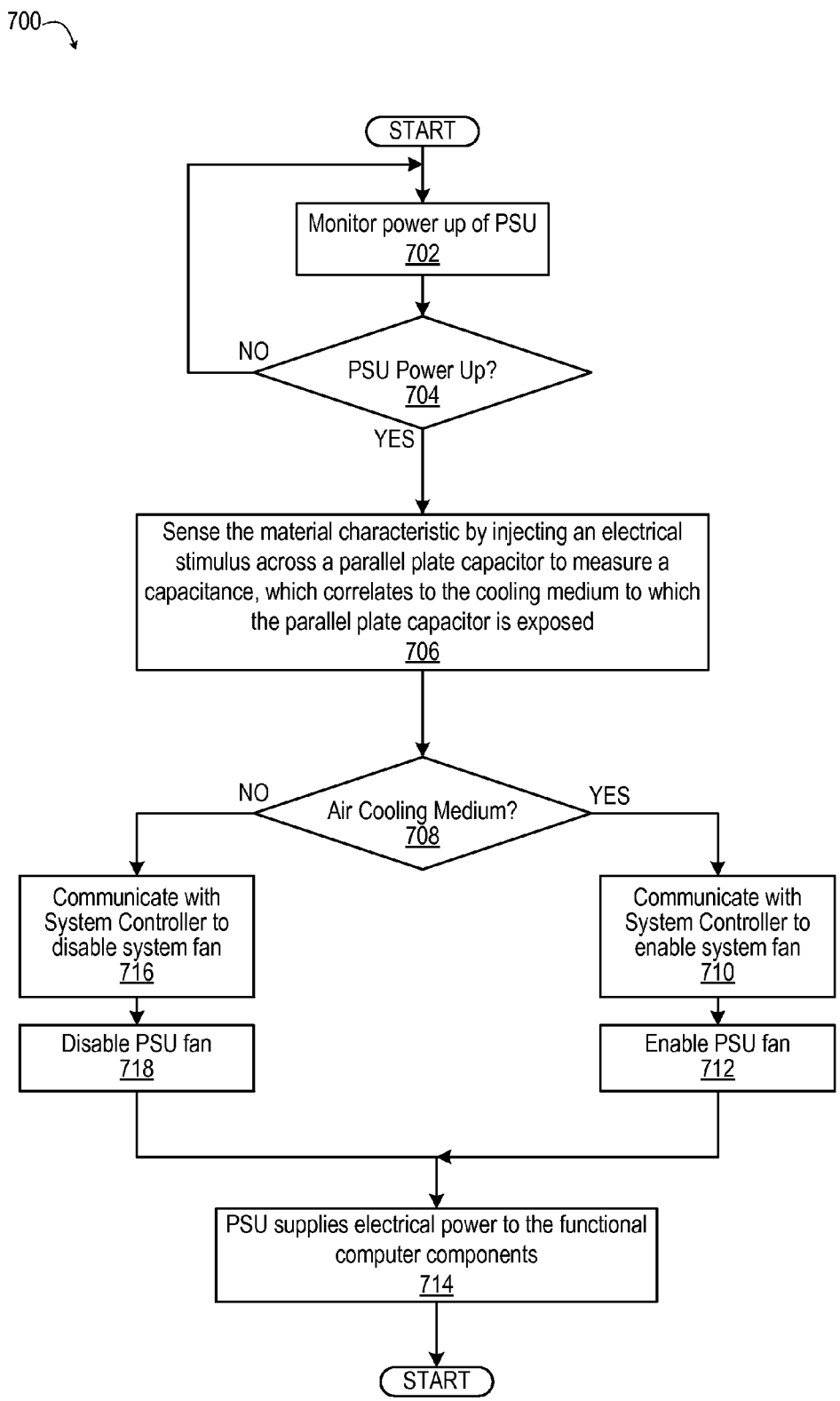
FIG. 7 illustrates a flow diagram of a method of a PSU providing electrical power to functional components of an IHS in either air or liquid cooling medium, according to one or more embodiments.

FIG. 7 illustrates a method 700 of a PSU providing electrical power to functional components of an IHS in either air or liquid cooling media. In one or more embodiments, the method 700 includes a thermal management controller monitoring a power up condition of the PSU (block 702). The thermal management controller determines whether the power up condition is detected (decision block 704). In response to determining in decision block 704 that a power condition is not detected, then method 700 returns to block 702 to wait for a power up condition where the PSU is called upon to provide electrical power to functional components. In response to the thermal management controller determining that a PSU power up condition exists in decision block 704, then the method 700 includes the thermal management controller sensing the material characteristic by injecting an electrical stimulus across a parallel plate capacitor to measure a capacitance, which correlates to the cooling medium to which the parallel plate capacitor is exposed (block 706). A determination is made by the thermal management controller as to whether the material characteristic sensed indicates an air cooling medium (decision block 708). In response to the determination in decision block 708 that the sensed material characteristic indicates air cooling medium, then the method 700 includes communicating with a system controller to enable a system fan (block 710). Method 700 includes enabling a PSU fan (block 712). Then, method 700 includes PSU supplying electrical power to the functional components. In response to the determination in decision block 708 that the material characteristic does not indicate an air cooling medium and is thus indicating a liquid cooling medium, then the method 700 includes communicating with the system controller to disable a system fan (block 716). Method 700 includes disabling the PSU fan (block 718). Then method 700 returns to block 714 to continue supplying electrical power. Then method 700 ends.

In the above described flow charts of FIGS. 5-7, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

For example, in one or more embodiments the thermal mitigation components 102 can disable an air operating mode by reverting to a liquid operating mode. Certain thermal mitigation components can be capable of efficiently and reliably operate in the liquid cooling medium 120 albeit at a different performance level. For example, the air mover 108 can provide a benefit by operating a reduced duty cycle that is appropriate for its motive capabilities, the viscosity of the liquid cooling medium, and the reduced convective flow rates required by the functional components 106.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) that automatically responds to a change in cooling medium, the IHS comprising:
    a chassis that has an interior space;
    functional components that are disposed within the interior space of the chassis and that require cooling;
    a cooling medium sensor that is positioned to sense a material characteristic of a cooling medium that is present in the interior space and that is one of an air cooling medium and a liquid cooling medium;
    a thermal mitigation component that is utilized to reduce a temperature of one or more of the functional components when the functional components are operating in an air cooling medium; and
    a thermal management controller in communication with the thermal mitigation component and the cooling medium sensor and which:
        determines whether the material characteristic received from the cooling medium sensor is in one of a first range that is associated with the air cooling medium and a second range that is associated with the liquid cooling medium; and
        in response to determining that the material characteristic is within the second range, disables the thermal mitigation component.

2. The IHS of claim 1, wherein the thermal mitigation component comprises a power throttle to reduce heat generation by one or more of the functional components.

3. The IHS of claim 1, wherein the thermal mitigation component comprises an air mover that is positioned to move air within at least a portion of the interior space.

4. The IHS of claim 1, wherein the cooling medium sensor comprises a parallel plate capacitor and an electrical stimulus driver to inject an electrical stimulus across the parallel plate capacitor to measure a capacitance, which correlates to the cooling medium to which the parallel plate capacitor is exposed.

5. The IHS of claim 1, wherein the thermal management controller enables the thermal mitigation component in response to determining that the material characteristic is within the first range.

6. The IHS of claim 1, wherein the thermal management controller comprises a memory and a processor that is in communication with the memory and which:
    determines whether the IHS is in a calibration mode; and
    in response to determining the calibration mode, stores, in the memory, a material characteristic that is currently sensed by the cooling medium sensor as one of the first range and the second range.

7. The IHS of claim 6, wherein the IHS determines the calibration mode by determining a first time power up condition.

8. The IHS of claim 1, further comprising a power supply unit (PSU) that comprises:
electrical conversion components that supplies electrical power to the functional components; and
a housing that contains the thermal management controller and the cooling medium sensor.

9. The IHS of claim 8, wherein:
the PSU further comprises a PSU fan to cool the electrical conversion components;
the IHS further comprises a system controller to control the thermal mitigation component; and
the thermal management controller, in response to determining that the material characteristic is within the second range, disables the PSU fan and to communicate with the system controller to disable the thermal mitigation component.

10. A power supply unit (PSU) of an information handling system (IHS) that automatically responds to a change in cooling medium, the PSU comprising:
a housing that has an interior space;
electrical conversion components that are disposed within the housing and that supply electrical power to functional components of the IHS;
a thermal mitigation component to reduce a temperature of one of the functional components of the IHS and the electrical conversion components of the PSU that are operating in an air cooling medium;
a cooling medium sensor that is positioned to sense a material characteristic of a cooling medium that is present in the interior space and that is one of the air cooling medium and a liquid cooling medium; and
a thermal management controller in communication with the thermal mitigation component and the cooling medium sensor to:
determine whether the material characteristic received from the cooling medium sensor is in one of a first range that is associated with the air cooling medium and a second range that is associated with the liquid cooling medium; and
in response to determining that the material characteristic is within the second range, disable the thermal mitigation component.

11. The PSU of claim 10, wherein the thermal mitigation component comprises a PSU fan to cool the electrical conversion components.

12. The PSU of claim 10, wherein:
the IHS comprises a system controller and the thermal mitigation component is to cool the functional components in the air cooling medium; and
the thermal management controller communicates with the system controller to disable the thermal mitigation component.

13. A method of automatically responding to a change in cooling medium in an information handling system (IHS), the method comprising:
sensing, via a cooling medium sensor, a material characteristic of a cooling medium that is present in an interior space of a chassis of an IHS;
a thermal management controller determining whether a material characteristic that is received from the cooling medium sensor is in one of a first range that is associated with an air cooling medium and a second range that is associated with a liquid cooling medium; and
the thermal management controller, in response to determining that the material characteristic is within the second range, disabling a thermal mitigation component utilized to reduce a temperature of functional components that are operating in the air cooling medium.

14. The method of claim 13, wherein the thermal mitigation component comprises a power throttle to reduce heat generation by the functional components.

15. The method of claim 13, wherein the thermal mitigation component comprises an air mover that is positioned to move air within at least a portion of the interior space.

16. The method of claim 13, wherein sensing the material characteristic comprises injecting an electrical stimulus across a parallel plate capacitor to measure a capacitance, which correlates to the cooling medium to which the parallel plate capacitor is exposed.

17. The method of claim 13, further comprising enabling the thermal mitigation component in response to determining that the material characteristic is within the first range.

18. The method of claim 13, further comprising:
determining whether the IHS is in a calibration mode;
in response to detecting the calibration mode, storing, in a memory, a material characteristic that is currently sensed by the cooling medium sensor as one of the first range and the second range, which is separated from the first range by a threshold; and
in response to detecting a subsequent power up condition, determining whether the material characteristic received from the cooling medium sensor is in one of the first range that is associated with the air cooling medium and the second range that is associated with the liquid cooling medium.

19. The method of claim 13, further comprising supplying electrical power to the functional components by electrical conversion components of a power supply unit (PSU) that houses the thermal management controller and the cooling medium sensor.

20. The method of claim 13, further comprising:
cooling the electrical conversion components with a PSU fan;
the thermal management controller, in response to determining that the material characteristic is within the second range, disabling the PSU fan and communicating with a system controller to disable the thermal mitigation component.

* * * * *